United States Patent [19]

Janning

[11] Patent Number: 5,539,317
[45] Date of Patent: Jul. 23, 1996

[54] CIRCUIT TESTER FOR CHRISTMAS TREE LIGHT SETS

[75] Inventor: John L. Janning, Dayton, Ohio

[73] Assignees: JLJ, Inc., Dayton, Ohio; Jay Cavender, Inc., Springboro, Ohio; a part interest

[21] Appl. No.: 335,506

[22] Filed: Nov. 7, 1994

[51] Int. Cl.$^6$ ..................................... G01R 31/02
[52] U.S. Cl. .................. 324/414; 324/530; 324/556; 324/632
[58] Field of Search .................... 324/414, 512, 324/527, 528, 530, 550, 555, 556, 632, 687, 688

[56] References Cited

U.S. PATENT DOCUMENTS

| | | | |
|---|---|---|---|
| 4,052,665 | 10/1977 | Gruenwald | 324/72.5 |
| 5,047,721 | 9/1991 | Farley | 324/414 |
| 5,319,312 | 6/1994 | Segilia | 324/556 |
| 5,369,363 | 11/1994 | Hey | 324/414 |

*Primary Examiner*—Kenneth A. Wieder
*Assistant Examiner*—Glenn W. Brown

[57] ABSTRACT

A novel apparatus for determining the location of an inoperative bulb in a series circuit of decorative Christmas tree type light bulbs is provided which comprises a housing member having an opening adapted to accommodate the physical insertion therein of each of the light bulbs to be tested while in said series circuit. An elongated electromagnetic radiation shield is fixedly secured within said opening and along the inner peripheral surface thereof and an elongated electro-magnetic radiation receptor is fixedly secured along the inner peripheral surface of said shield and insulated therefrom and adapted to intercept electromagnetic radiation which is radiated from a light bulb inserted therein. A battery operated audio amplifier is mounted within said housing and has an input terminal and an output terminal. An energizable signal indicator is fixedly secured to said housing. Finally, means are provided to couple the electromagnetic radiation intercepted by said receptor to the input terminal of said audio amplifier and to couple the output of the audio amplifier to the indicator whereby the indicator is energized whenever electromagnetic radiation is radiated from an inserted light bulb.

3 Claims, 2 Drawing Sheets

CIRCUIT TESTER FOR CHRISTMAS TREE LIGHT SETS

TECHNICAL FIELD

The present invention relates generally to apparatus for testing strings of incandescent light bulbs to locate inoperative bulbs.

Strings of miniature and other incandescent light bulbs are extremely popular for use in decorative arrangements, particularly during the holiday seasons, particularly during Christmas time. One of the most common is for decoration of Christmas trees. The sets are usually strung in series with a minimum of fifteen bulbs or more. Sets with large numbers of bulbs are generally divided into multiple sections in which the bulb filaments in each section are electrically connected in series. Thus, when one bulb fails to illuminate, a whole section fails to light and it is very frustrating and time consuming to locate and replace the failed bulb. Usually many bulbs have to be checked and replaced before finding the failed bulb. In fact, in many instances the frustration and time consuming efforts are so great as to cause the entire string of lights to be completely discarded and replaced with new string before they are even placed on the Christmas Tree.

Radio Shack presently markets a so-called "line voltage sensor-detector" which is apparently made off-shore under the tradename "Micronta" and which is also capable of testing Christmas tree lamps by holding the tester close to the lamp to be tested. However, it is simply a field strength device that may remain "on" if the tree lamps to be tested are close enough together. Such a proximity detector of a.c. line voltage is not user friendly to those not particularly knowledgeable from an electrical standpoint.

While there are presently available various apparatuses for testing individual bulbs, there is no apparatus presently known which is inexpensive, hand held, battery operated, simple to use, and can be used to rapidly locate the failed bulb without even the necessity of removing any of the bulbs.

PRIOR ART

Exemplary prior art patents include the following:

| | | | |
|---|---|---|---|
| 2,917,705 | 3,760,266 | 4,361,800 | 5,008,626 |
| 3,063,006 | 4,052,665 | 4,943,752 | 5,047,721 |

SUMMARY OF THE INVENTION

In accordance with the present invention, applicant has devised a very simple and yet highly effective circuit tester for Christmas tree light sets which basically comprises an inexpensive field strength meter, or indicator, which is provided with a grounded shield around a cavity sensing element whereby all outside signals are eliminated by the grounded shield and only the light bulb inserted therein is tested without the necessity of removing the bulb from its socket.

DESCRIPTION OF THE PREFERRED EMBODIMENT

Figure 1:
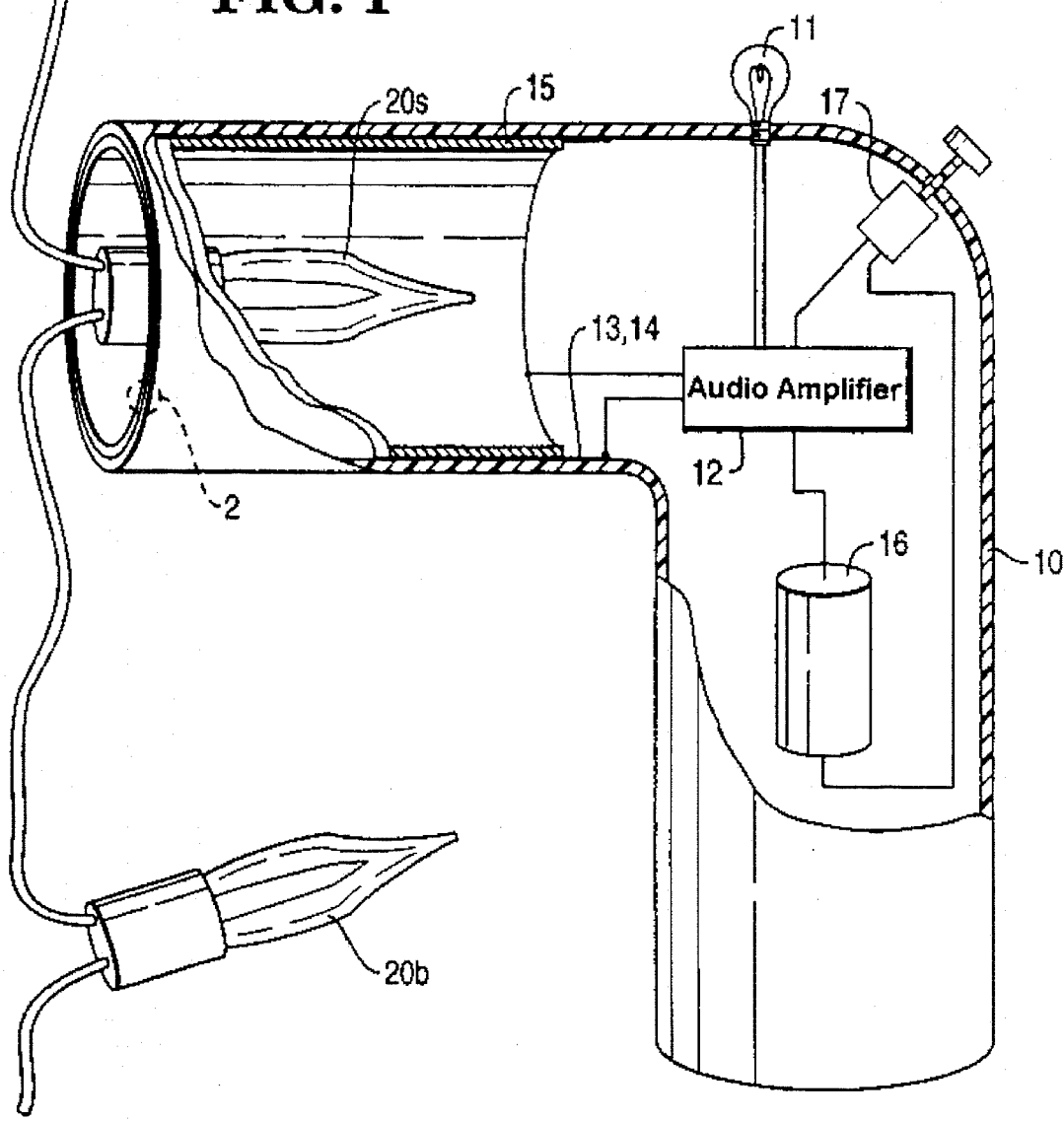
FIG. 1 is a perspective view, partly in section, of the component parts of a circuit tester for Christmas tree light sets constructed in accordance with a preferred embodiment of the present invention.

With reference to FIG. 1 of the drawings, a circuit tester constructed in accordance with a preferred embodiment of the present invention preferably includes an L-shaped, cylindrical housing 10 composed of either metallic or non-metallic material, preferably extruded plastic or other insulating material. Mounted on the outer wall of housing 10 is an indicator light 11 which is electrically connected to a typical audio amplifier 12 fixedly mounted within housing 10 and which is capable of amplifying 60 hertz radiation in a well known matter. A Radio Shack Model LM386 integrated circuit audio amplifier has been found to work quite well with electrical connection of the leads from indicator light 11 being electrically connected to appropriate terminals of amplifier 12 as more clearly shown in FIG. 3.

Figure 2:
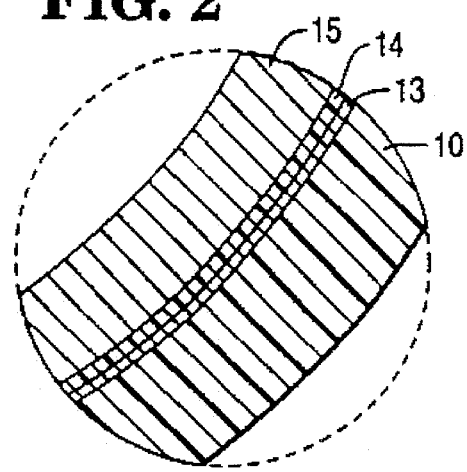
FIG. 2 is a partial end view of a segment of the side wall of the grounded shield cavity sensing element shown in FIG. 1 at designation numbered "2"; and, FIG. 3 is an electrical schematic view of the circuit tester shown in FIG. 1.

As more clearly shown in FIG. 2, press-fitted or otherwise formed on the inner cylindrical surface of the opening of housing 10 is preferably a first thin film of copper material 13 which functions as a magnetic shield; press-fitted or otherwise formed on the inner cylindrical surface of copper shield 13 is preferably a film of insulating material 14; and, press-fitted or otherwise formed on the inner cylindrical surface of insulator 14 is preferably a second thin film of copper material 15 which functions as the input or electromagnetic field sensing element for the circuit tester. Also located within housing 10 is a typical 9 volt battery 16 which is serially connected between amplifier 12 and on-off switch 17 which is fixedly mounted on the sidewall of housing 10.

Figure 3:
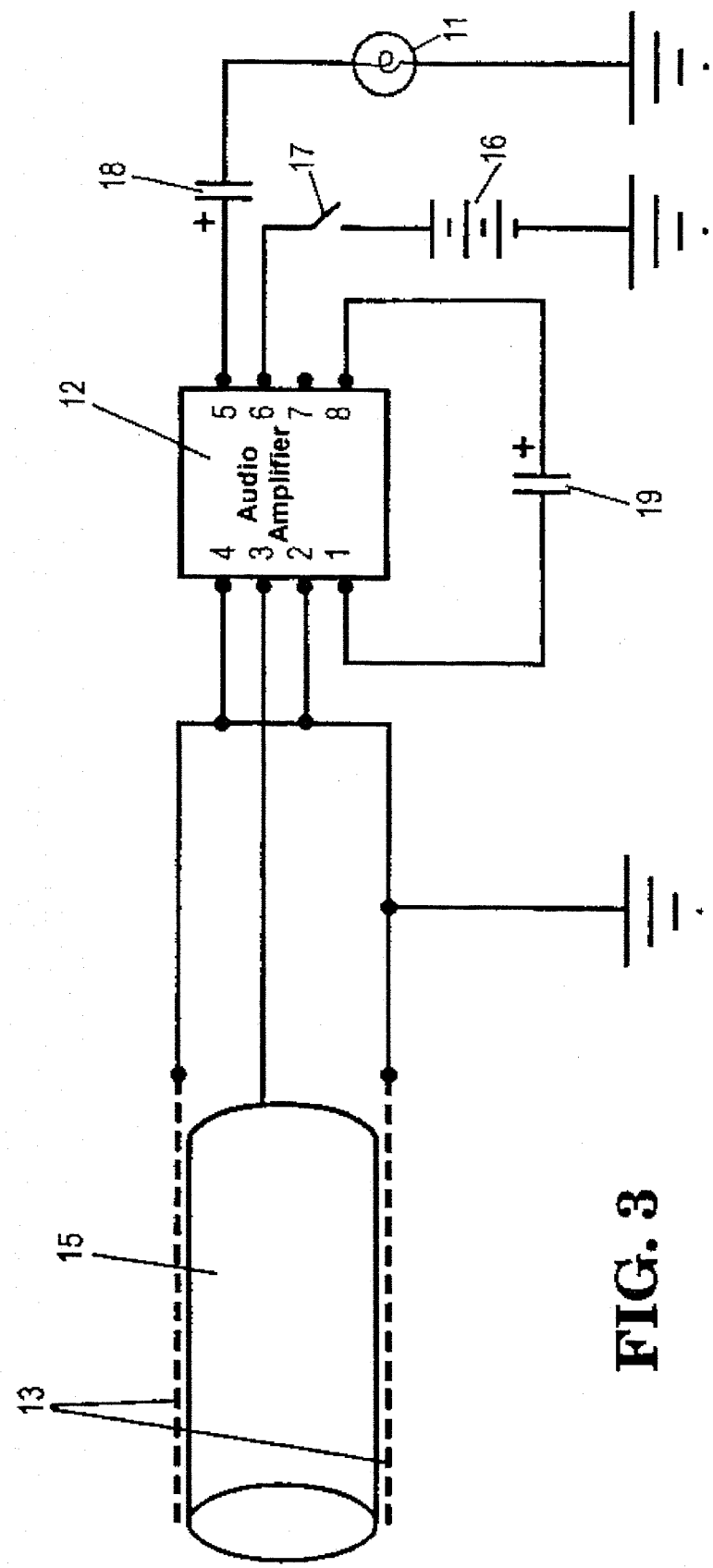

With reference now to the schematic drawing in FIG. 3, electromagnetic shield 13 is electrically connected to terminals 2 and 4 of amplifier 12 and to ground or other suitable reference potential, while sensor element 15 is connected to terminal 3. Battery 16 is serially connected between ground or reference potential and on-off switch 17 whose remaining terminal is connected to terminal 6 of amplifier 12. Indicator light 11 is serially connected between ground or reference potential and the negative terminal of a suitable capacitor 18 (not shown in FIG. 1) whose remaining terminal is connected to terminal 5 of amplifier 12. And, a second capacitor 19 (not shown in FIG. 1.) is connected between terminals 1 and 8 of amplifier 12 as shown.

A suitable indicator light 11 can be purchased from Radio Shack as part number 272-1139. Capacitors 18 and 19 can vary in values, but typical values are 47 and 33 microfarads, respectively.

During operation, capacitor 18 blocks direct current from flowing through indicator light 11, keeping the indicator light off. However, when an alternating electromagnetic field is sensed by sensing element 15, the a.c. signal is amplified by the integrated circuit amplifier 12 which impresses a relatively large a.c. signal component on capacitor 18. This a.c. component then flows through capacitor 18, thereby illuminating indicator light 11.

The overall operation of the system is as follows: On-off switch 17 is first switched to the "on" position. Thereafter, preferably the first light bulb in the string, illustrated as 20(s) in FIG. 1, is placed within the shielded cavity of the circuit tester; alternatively, the shielded cavity is placed over the first light bulb in the string while the bulb is still mounted in its socket and its corresponding string is still located on the Christmas tree and still plugged into the wall outlet. Indicator light 11 will either remain in a non-illuminated or "off" condition or state, or it will become illuminated or in an "on" condition or state, regardless of whether the first bulb being tested is defective or whether it is a good bulb. In other words, it does not matter which condition exists with respect to the first bulb being tested. The shielded cavity is thereafter sequentially placed over each next successive light bulb in the string until the light action of indicator light 11 changes, i.e., it will either turn "on" or it will remain "off". If indicator light 11 remains "on" when a plurality of successive bulbs are placed within the shielded cavity and then goes "off" when the shielded cavity is placed on the next adjacent light bulb, then one of the following conditions will exist: (i) either the bulb which caused indicator light 11 to stay "on" or the next adjacent bulb which caused indicator light 11 to turn "off", is defective; or, (ii) the socket of the particular bulb causing indicator light 11 to turn "off" is defective; or, (iii) the last mentioned bulb is not properly connected. Likewise, if indicator light 11 is "off" when the shielded cavity is placed sequentially placed over each next successive bulb and then suddenly goes "on" when the shielded cavity is placed over the next adjacent bulb, then one of the same three conditions mentioned above as (i), (ii) or (iii) exist. In other words, in the first example when indicator light 11 remained "off" when adjacent bulbs were sequentially tested, and then turned "on", then the bad bulb is the particular bulb which is located adjacent to the last bulb tested which caused indicator light to stay "off". Conversely, in the second example above, the bad bulb is the one causing indicator light 11 to turn "off".

However, in the event testing should begin with the very first bulb in the string from the grounded terminal and that particular bulb is faulty, then a zero voltage will be applied to the first terminal of the bulb and essentially 110–120 volts 60 hertz voltage will be applied to the adjacent terminal of that particular bulb. As a result, the second terminal having full alternating voltage applied thereto will radiate a relatively strong 60 hertz electromagnetic field which is detected by the tester, causing the light indicator to illuminate indicating that the first bulb is faulty.

Alternatively, an audible buzzer may be substituted for the light indicator to create audible detection rather than visible detection with substantially the same effective result.

The cavity (or bulb input chamber) can be easily fabricated from a sheet of plastic material with a metal conductor formed on each side. This could be a sheet of plastic material with a silk screened electrical conductor screened and cured on each side of the material. Such a structure resembles a capacitor.

This sheet is then rolled into a cylinder, thus forming the inside cavity electrode and the outer shield electrode which is grounded in the circuitry. Such fabrication makes for a low cost cavity unit.

Another method of forming the cavity consists of coating the outside of a plastic or glass test tube with an electrical conductor. Over this is placed a dielectric coating. Another electrical conductor is then placed over the dielectric. The advantage of this kind of fabrication is that the Christmas tree lamp to be tested is placed inside the test tube which is totally isolated from the tester circuitry by the thickness of the test tube wall.

By whatever method or means the cavity is formed, it is preferable that it have an opening of approximately three-fourths of an inch in diameter and the length is preferably approximately one and one-half inches in order for the entire lamp can be fully inserted within the opening or cavity.

The cavity capacitance between the shield and the cavity electrode is preferably in the order of five hundred picofarads. Normally, too low of capacitance will cause the indicator lamp to be "on" all of the time. Conversely, too high a value will adversely affect the input signal. The successful prototype units tested ranged from four hundred sixty (460) to six hundred forty (640) picofarads input capacity.

Having so described and illustrated the principles of my invention in a preferred embodiment, it is intended, therefore, in the annexed claims, to cover all such changes and modifications as may fall within the scope and spirit of the following claims:

I claim:

1. Apparatus for determining the location of an inoperative bulb in a series circuit of decorative Christmas tree type light bulbs, the combination comprising:

a housing member having an opening adapted to accommodate the physical insertion therein of each of the light bulbs to be tested while in said series circuit;

an elongated electromagnetic radiation shield fixedly disposed within said opening;

an elongated electromagnetic radiation receptor fixedly disposed within said electromagnetic radiation shield and insulated therefrom and adapted to intercept electromagnetic radiation which is radiated from a light bulb inserted therein;

a battery operated audio amplifier mounted within said housing and having an input terminal and an output terminal;

an energizable signal indicator fixedly secured to said housing;

means for coupling electromagnetic radiation intercepted by said electromagnetic radiation receptor to the input terminal of said audio amplifier; and means for coupling the output of said audio amplifier to said indicator to energize said indicator whenever electromagnetic radiation is radiated from an inserted light bulb.

2. Apparatus in accordance with claim 1 wherein the opening of said housing member is substantially of cylindrical configuration.

3. Apparatus for determining the location of an inoperative bulb in a series circuit of decorative Christmas tree type light bulbs, the combination comprising:

a housing member having an opening adapted to accommodate the physical insertion therein of each of the light bulbs to be tested while in said series circuit;

an elongated electromagnetic radiation shield fixedly secured to the side walls of said opening;

an elongated electromagnetic radiation receptor fixedly secured to the side walls of said electromagnetic radiation shield and insulated therefrom, and adapted to intercept electromagnetic radiation which is radiated from a light bulb inserted in the opening thereof;

a battery operated audio amplifier mounted within said housing and having an input terminal and an output terminal;

an energizable and visible signal indicator fixedly secured to said housing;

means for coupling electromagnetic radiation intercepted by said electromagnetic radiation receptor to the input terminal of said audio amplifier; and means for coupling the output of said audio amplifier to said indicator to illuminate said indicator whenever significant electromagnetic radiation is radiated from an inserted light bulb.

* * * * *